| 
US007571362B2

(12) United States Patent
Pellicone et al.

(10) Patent No.: US 7,571,362 B2
(45) Date of Patent: Aug. 4, 2009

(54) METHOD OF MANAGING FAILS IN A NON-VOLATILE MEMORY DEVICE AND RELATIVE MEMORY DEVICE

(76) Inventors: Demetrio Pellicone, Via della Fratellanza, 8, 87040 Castrolibero (IT); Adamo Corsi, Via Boccaccio, 451, 20099 Sesto San Giovanni (IT); Marco Roveda, Via Ticino, 33/22, 20086 Motta Visconti (IT); Concetta Di Tuoro, Via Cavour, 26, 80040 Pollena Trocchia (IT); Procolo Carannante, Via Quinta Trav. Licola Patria, 7, 80078 Pozzuoli (IT); Gianfranco Ferrante, Via San Martino, 117, 80046 San Giorgio a Cremano (IT)

( * ) Notice: Subject to any disclaimer, the term of this patent is extended or adjusted under 35 U.S.C. 154(b) by 353 days.

(21) Appl. No.: 11/557,786

(22) Filed: Nov. 8, 2006

(65) Prior Publication Data
US 2007/0109856 A1    May 17, 2007

(30) Foreign Application Priority Data
Nov. 8, 2005    (IT) .......................... VA2005A0061

(51) Int. Cl.
*G01C 29/00* (2006.01)
(52) U.S. Cl. .......................... 714/723; 714/42
(58) Field of Classification Search .................. 714/5, 714/8, 7, 721, 718, 723, 42; 365/185.09, 365/200; 711/115
See application file for complete search history.

(56) References Cited

U.S. PATENT DOCUMENTS

| 5,473,753 | A | * | 12/1995 | Wells et al. ................... 714/5 |
| 5,477,492 | A | * | 12/1995 | Ohsaki et al. ............... 365/200 |
| 5,479,609 | A | * | 12/1995 | Hsu et al. ...................... 714/8 |
| 5,535,328 | A | * | 7/1996 | Harari et al. .................. 714/7 |
| 5,577,194 | A | * | 11/1996 | Wells et al. .................... 714/8 |
| 5,630,093 | A | * | 5/1997 | Holzhammer et al. ....... 711/115 |
| 5,659,550 | A | * | 8/1997 | Mehrotra et al. ............ 714/721 |
| 5,671,229 | A | * | 9/1997 | Harari et al. ................ 714/710 |
| 6,260,156 | B1 | | 7/2001 | Garvin et al. .................. 714/8 |
| 6,288,940 | B1 | | 9/2001 | Kawamura ............. 365/185.09 |
| 7,352,621 | B2 | * | 4/2008 | Rothman et al. ....... 365/185.09 |

FOREIGN PATENT DOCUMENTS

EP    1469481    10/2004

\* cited by examiner

*Primary Examiner*—David Ton
(74) *Attorney, Agent, or Firm*—Schwabe, Williamson & Wyatt, P.C.

(57) ABSTRACT

A method of managing fails in a non-volatile memory device including an array of cells grouped in blocks of data storage cells includes defining in the array a first subset of user addressable blocks of cells, and a second subset of redundancy blocks of cells. A third subset of non-user addressable blocks of cells is defined in the array for storing the bad block address table of respective codes in an addressable page of cells of a block of the third subset. Each page of the third subset is associated to a corresponding redundancy block. If during the working life of the memory device a block of cells previously judged good in a test phase becomes failed, each block is marked as bad and the stored table in the random access memory is updated.

18 Claims, 10 Drawing Sheets

ARCHITECTURE OF THE
MEMORY ARRAY

| ADDRESSES OF BAD BLOCKS | | | | | | FLAGS | |
|---|---|---|---|---|---|---|---|
| A0 | A1 | A2 | A3 | ... | Ak | F0 | F1 |
| A0 | A1 | A2 | A3 | ... | Ak | F0 | F1 |
| A0 | A1 | A2 | A3 | ... | Ak | F0 | F1 |
| A0 | A1 | A2 | A3 | ... | Ak | F0 | F1 |
| . | . | . | . | ... | . | . | . |
| . | . | . | . | ... | . | . | . |
| . | . | . | . | ... | . | . | . |
| A0 | A1 | A2 | A3 | ... | Ak | F0 | F1 |
| A0 | A1 | A2 | A3 | ... | Ak | F0 | F1 |

METHOD OF MANAGING FAILS IN A NON-VOLATILE MEMORY DEVICE AND RELATIVE MEMORY DEVICE

FIELD OF THE INVENTION

The invention relates to memory devices, and more particularly, to a method of managing failed blocks of array cells and to a non-volatile memory device comprising dedicated logic circuits for implementing the method.

BACKGROUND OF THE INVENTION

NAND FLASH memories are large integration scale devices capable of storing vast amounts of data. These devices have a cell array organized in blocks of memory cells electrically connected in series. Each block is generally organized in a certain number of pages of data storage space. Because of their commercial importance, reference will be made to these FLASH memory devices, but the technical approaches that will be described may be implementable in any non-volatile memory of similar architecture and constraints.

NAND FLASH memory devices have intrinsic problems of efficiency due to the peculiar architecture of the array of cells, and to the relatively high voltages that are applied during program operations. The high voltages may damage the cells.

Blocks of cells that contain one or more failed bits are designated bad blocks. They may already be present in the array as fabricated, and are detected during the test on wafer phase to which each device is subjected. They may also develop during the working life of the device.

All the cells of valid blocks are initially in the erased state. All memory locations have the code FFh stored therein. Typically, in a test on wafer phase (EWS), failed blocks are marked bad and as much as possible they are substituted with corresponding redundancy blocks.

Commonly, the state of each block, as verified during a test on wafer phase, is stored in a respective subset of array cells commonly called the spare area. If the spare area associated to a block does not store the code FFh in the first page, it then means that the block has been marked bad.

To impede access to failed blocks, a dedicated table of bad blocks and of corresponding redundancy blocks table is generated, on which eventual re-mapping operations may be implemented.

The table of failed blocks is generated by reading the cells of the spare area of the memory blocks and is saved in a good block. At every start-up of the memory device, the bad block table is loaded in a RAM memory and is read for re-mapping bad blocks to respective redundancy blocks.

During the working life of the memory device, in any case after the EWS phase, some blocks initially recognized as good may become unusable because one or more cells of the block fails. Newly developed bad blocks are located when an attempt to program or erase them is carried out and the state register of the memory signals the failure. When this occurs, these new fail blocks need to be substituted with other available good redundancy blocks in which data should be copied.

For this purpose, software implemented algorithms are commonly used, such as that illustrated in the block diagram of FIG. 1, for updating the bad block table. This software for managing bad blocks, executed by circuitry commonly referred to by the acronym BBM (Bad Block Management), identifies newly failed blocks and updates the bad block table for re-mapping read or write operations addressing bad blocks to the corresponding substitute redundancy blocks.

Operations carried out by this software are the following. At the start up of the memory device, the cells of the spare area of each block are read. From the read information, a bad block table to be loaded in the external RAM for re-mapping accesses to bad blocks is obtained. Should a good block fail at a certain time of the working life of the NAND FLASH memory device, this block is marked as bad by writing the information in the cells of the spare area, and is updated in the RAM memory for inhibiting access to it.

This procedure is difficult from a computational point of view and requires a non-volatile memory space of non-negligible size in which the complex codes of the management software are to be stored. Specially in low end memory devices, this represents a relevant cost. At every turn on of the device, the bad block management software needs to read the spare area associated to each block of cells, and generate an eventually updated bad block address table to be loaded in the RAM memory.

When a block that was initially good develops a fail during the working life of the memory device, the management software marks the newly found bad block and prevents any access to it. As a consequence, the capacity of the FLASH memory progressively decreases during its working life.

U.S. Pat. No. 6,288,940 discloses a non-volatile memory comprising a circuit for impeding access to newly developed bad blocks.

Published European patent application EP 1,469,481 discloses a method and device for managing, during the functioning, of bad memory blocks detected in a phase of test on wafer (EWS). The method uses software for managing eventual bad blocks that may develop fails during the working life of the memory device.

U.S. Pat. No. 6,260,156 discloses a method for managing bad memory blocks, wherein memory access operations are stopped when access to a bad block, the address of which is stored in a non-volatile fashion in a table, is attempted.

SUMMARY OF THE INVENTION

An object of the invention is to provide a method of managing fails in a non-volatile memory device that may be easily implemented with a dedicated hardware of relatively low cost integrable in the device.

Fast non-volatile memory devices are formed because the management of all defective blocks, even failed blocks identified during the working life of the device, is automatically implemented in a transparent fashion for the user. The user does not experience any reduction of the capacity of the memory device even if certain blocks, that are considered good at the test on wafer, should eventually fail.

This result is achieved by reserving a subset of redundancy cells and another subset of the memory array cells dedicated to store in a non-volatile fashion the bad block table. This table is organized in rows each storing the address of a bad block and to each row being associated a respective block of redundancy cells.

At start-up of the memory device, it is no longer necessary to read a spare area of each block because a dedicated control circuit accesses the page of the memory in which the bad block table has been saved, and copies it in a dedicated RAM. When a block identified as a good block in the device as manufactured develops a fail, the bad block address table is updated in the dedicated RAM. Thus, an updated new page including the updated bad block table is eventually stored in the dedicated subset of cells.

Therefore, a new spare redundancy memory block becomes automatically associated to the newly developed bad block of the memory cell array that is rendered inaccessible. Users will not notice any change because the memory device retains the same capacity as long as there are available redundancy resources. Moreover, substitution of a block of cells with a redundancy block may even be commanded by the user.

BRIEF DESCRIPTION OF THE DRAWINGS

The invention will be described referring to the attached drawings, wherein.

DETAILED DESCRIPTION OF THE PREFERRED EMBODIMENTS

Figure 2:
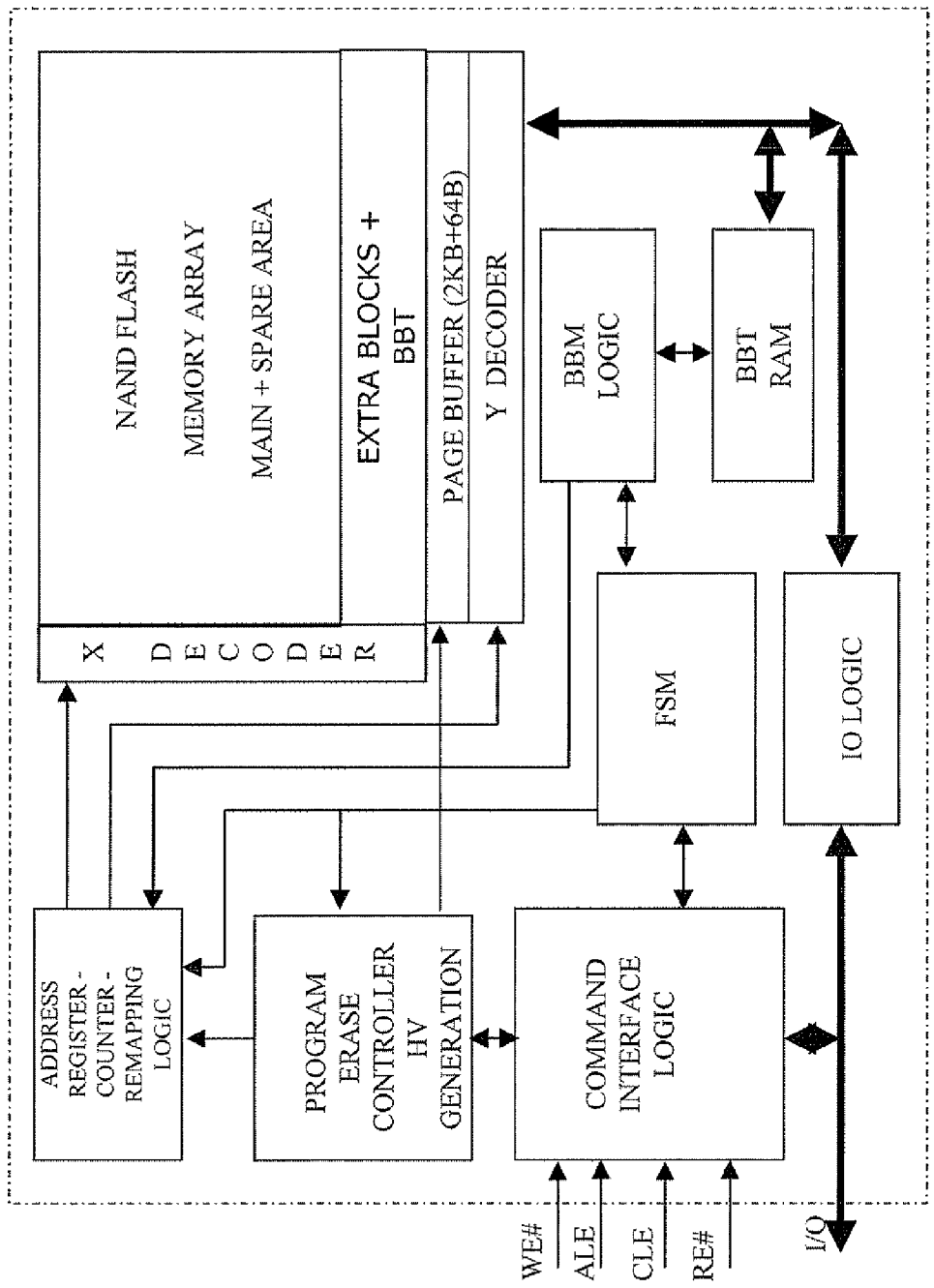
FIG. 2 shows a NAND FLASH memory device according to the invention.

A basic architecture of a memory device that implements the method of the invention is depicted in FIG. 2. The array of memory cells is divided into first, second and third subsets. The first subset (MAIN) is composed of user addressable blocks of cells. The second subset (EXTRA BLOCKS) is composed of blocks of redundancy cells. The third subset (BBT) is for storing the table of addresses of bad blocks.

A fourth subset SPARE AREA of dedicated cells for storing the code (FFh) in a first page of each block acknowledged as good could still be present as a reserved tool for checking the statues, but it is not necessary for the management of fails according to the invention.

The meaning of the other functional blocks depicted in FIG. 2 is clarified in TABLE 1:

TABLE 1

| ADDRESS REGISTER | Register that stores the address of the currently addressed page. |

TABLE 1-continued

| COUNTER | Address counter of the array, used during algorithms for accessing the array (read, program, erase). |
| REMAPPING LOGIC | Logic circuitry for remapping that receives information about bad blocks from the BBM LOGIC and remaps a bad block to a redundancy block. |
| PROGRAM ERASE CONTROLLER HV GENERATION | Inner microcontroller that carries out read, program and erase algorithms and controls the circuits for generating high programming voltages. |
| COMMAND INTERFACE LOGIC | User interface that decodes user commands. |
| FSM | State machine that controls the operations for managing bad blocks, for transferring data from the PAGE BUFFER to the BBT RAM and vice versa. It controls also the BBM LOGIC circuit. |
| BBM LOGIC | Interface between the FSM and the BBT RAM. It includes a logic circuitry for carrying out operations for managing bad blocks and a logic circuitry for controlling the remapping operation and the operation of locating bad blocks. |
| BBT RAM | RAM that stores the table used by the BBM LOGIC for remapping. |

The meaning of the signals present in FIG. 2 is clarified in TABLE 2:

TABLE 2

| WE | Write enable |
| ALE | Address latch enable |
| CLE | Command latch enable |
| RE | Read enable |
| I/O | Input/Output data bus |

Figure 1:
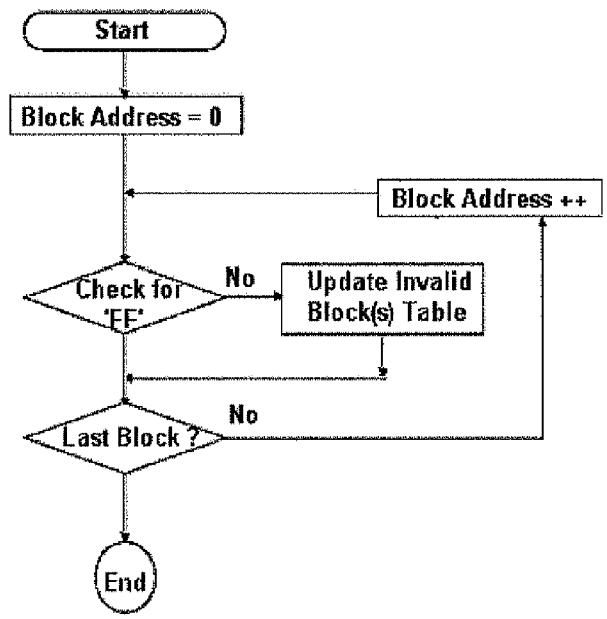
FIG. 1 is a flow chart of the algorithm carried out by software for managing bad blocks of a NAND FLASH memory according to the prior art.
Figure 3:
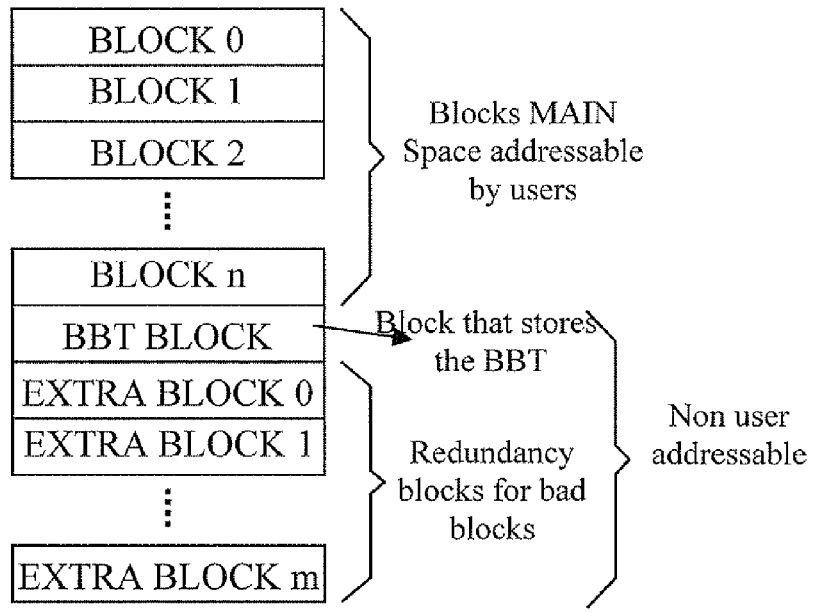
FIG. 3 schematically shows the organization of blocks of cells of a non-volatile memory according to the invention.
Figures 4, 7:
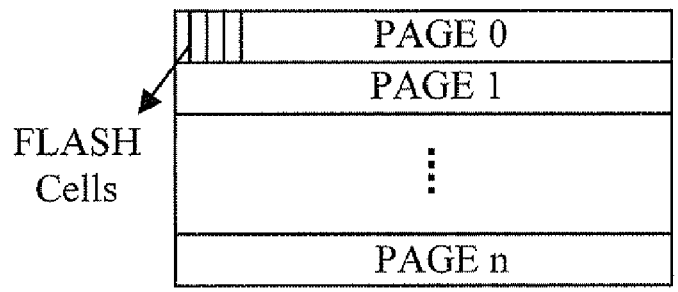
FIG. 4 shows the organization of a block of memory cells according to the invention.
FIG. 7 shows the organization of a block of cells for storing the bad block table according to the invention.

The whole array of memory cells is organized as shown in FIG. 3, with each block being organized in pages as shown in FIG. 4. There are n+1 blocks that are directly addressable by the user, a dedicated block for storing the bad block address table, and m+1 redundancy blocks (EXTRA BLOCK).

As stated above, the fourth subset of cells SPARE AREA is not necessary. For this reason, in FIG. 3 such an unnecessary subset of cells is not depicted.

When the memory device is started-up, the FSM circuit accesses the page of the block that stores the bad block address table and copies its content in the embedded BET RAM. When a block of cells of the array needs to be accessed, the BBM LOGIC looks up the table stored in the BBT RAM and, if the address of the block to be accessed is stored therein, it remaps the access to the redundancy block of cells associated thereto.

Each time, during the working life of the memory, a new bad block is located because of the failure of a commanded read, program or erase operation. The FSM circuit saves the address of the new bad block in the BBT RAM memory, and the updated bad block table is non-volatile written in a new page of the block of the third subset (BBT).

Therefore, the memory device recognizes all bad blocks simply by reading the bad block address table stored in the BBT RAM, without having to scan the subset SPARE AREA for identifying all bad blocks, as it is commonly forced to do by the software for managing bad blocks in the known NAND FLASH devices. According to the invention, such a reserved spare area may be omitted.

Substitution of a bad block that may even be a used redundancy block, and during the working life of the memory develops a fail with another available redundancy block, takes place automatically. This is done in a perfectly transparent fashion to the user who continues to use a memory of unchanged storage capacity.

Figure 5:
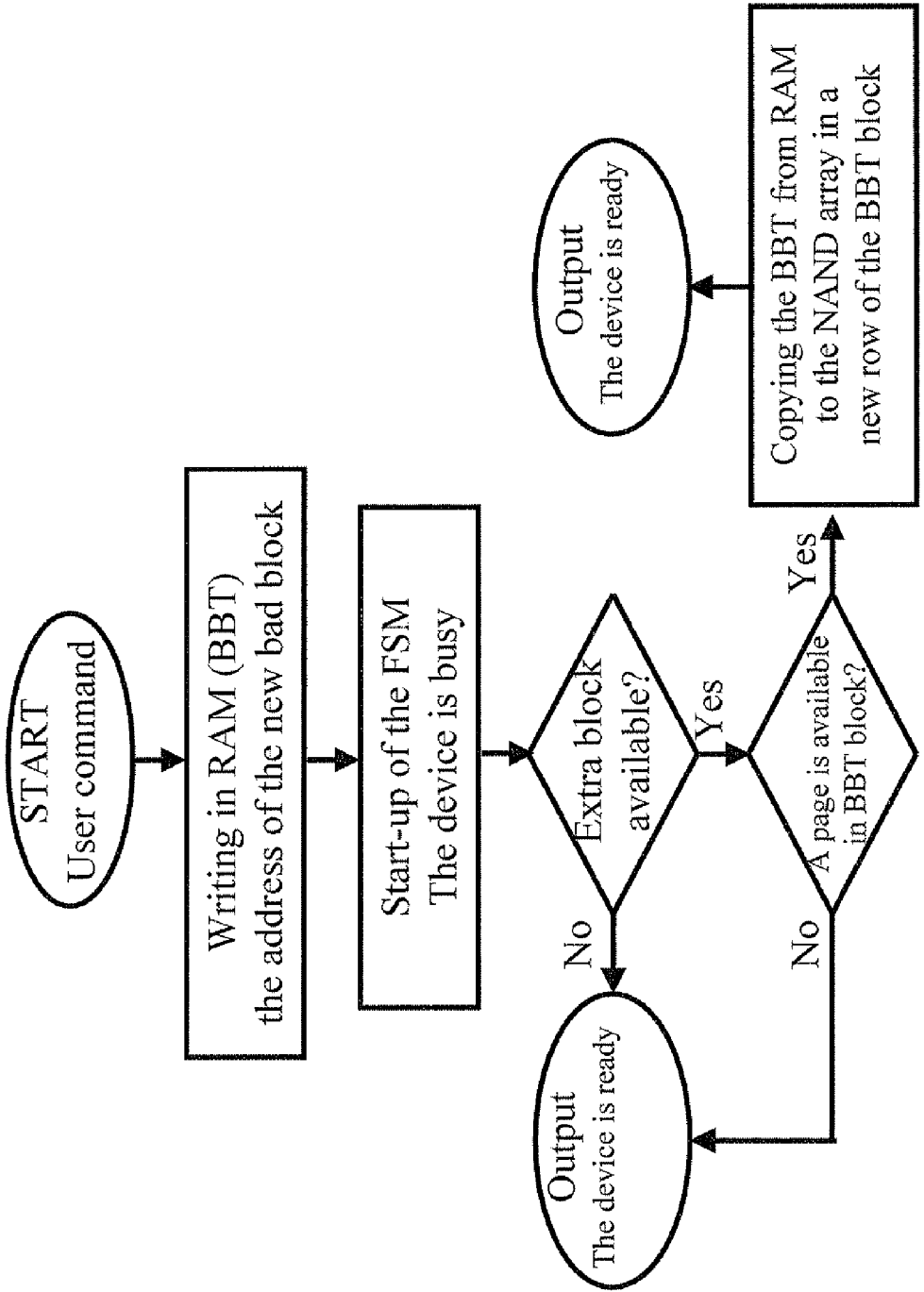
FIG. 5 is a flow chart of the substitution operation for a bad block according to the invention.
Figure 6:
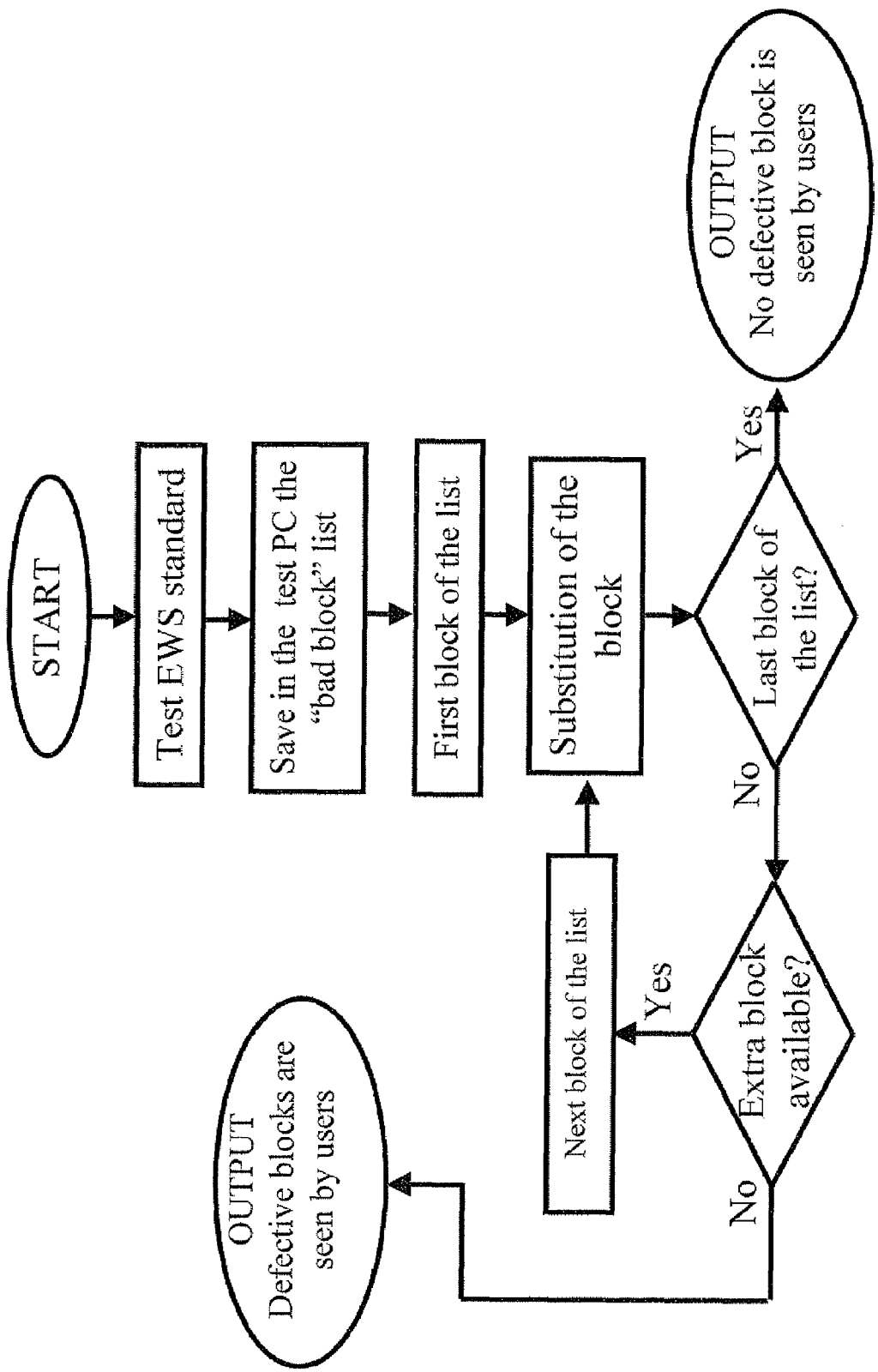
FIG. 6 is a flow chart of the remapping algorithm for the defective blocks identified during a test on wafer (EWS) according to the invention.

An example of an algorithm for automatically substituting bad blocks AUTOMATIC BLOCK SUBSTITUTION, located in the stored table, is shown by way of example in the flow chart of FIG. 5. This algorithm is generally executed each time it is necessary to substitute a block of cells with another redundancy block, for example immediately after the test on wafer (EWS), as shown in the flow chart of FIG. 6.

The fact that the bad block address table is conveniently stored in a new page of the block of cells dedicated for this purpose each time that a new bad block is identified, makes the cells of the block BBT BLOCK programmed only once, and thus do not undergo repeated stresses.

According to one embodiment, the block of cells BBT BLOCK is organized as shown in FIG. 7. There are columns $a_0 \ldots a_k$ dedicated to store bits of bad block addresses, and two columns dedicated to store the flags F0 and F1.

The flag F0 of the i-th row signals whether the redundancy block associated to the i-th row is good (1) or bad (0). If the flag F0 is 0, the redundancy block associated to the i-th row cannot be used. In this case the address of the i-th row is copied in a new row of the block BBT BLOCK to remap the bad redundancy block to a good redundancy block. The flag F1 of the i-th row signals whether the redundancy block associated to the i-th row is used or not.

At the start-up of the memory device, the state machine FSM looks for the page of the block BBT BLOCK in which the updated version of the bad block address table is stored simply by reading the flags F0 and F1 stored in the various pages. Indeed, an unused page has all flags F0 and F1 (and also all address bits $a_0 \ldots a_k$) at the logic value 1 (erased cells).

Each address stored in the block BBT BLOCK is repeated five times. At the start-up of the device, each address bit is identified based on a majority decision in order to reduce the error probability.

In all read, program and erase operations, the effective address of the block is given by the BBM LOGIC circuit, that compares the external address provided by the user of the block to be accessed with all addresses written in the BBT table. If the result of these comparisons is negative, the operation is carried out on the block corresponding to that address. Otherwise, the substitute redundancy block is accessed.

The memory device may carry out the following five commands:
1) USER BLOCK SUBSTITUTION;
2) BBT PROGRAM;
3) BBM DISABLE;
4) BBM ENABLE; and
5) BBM PAGE COPY.

Figure 8:
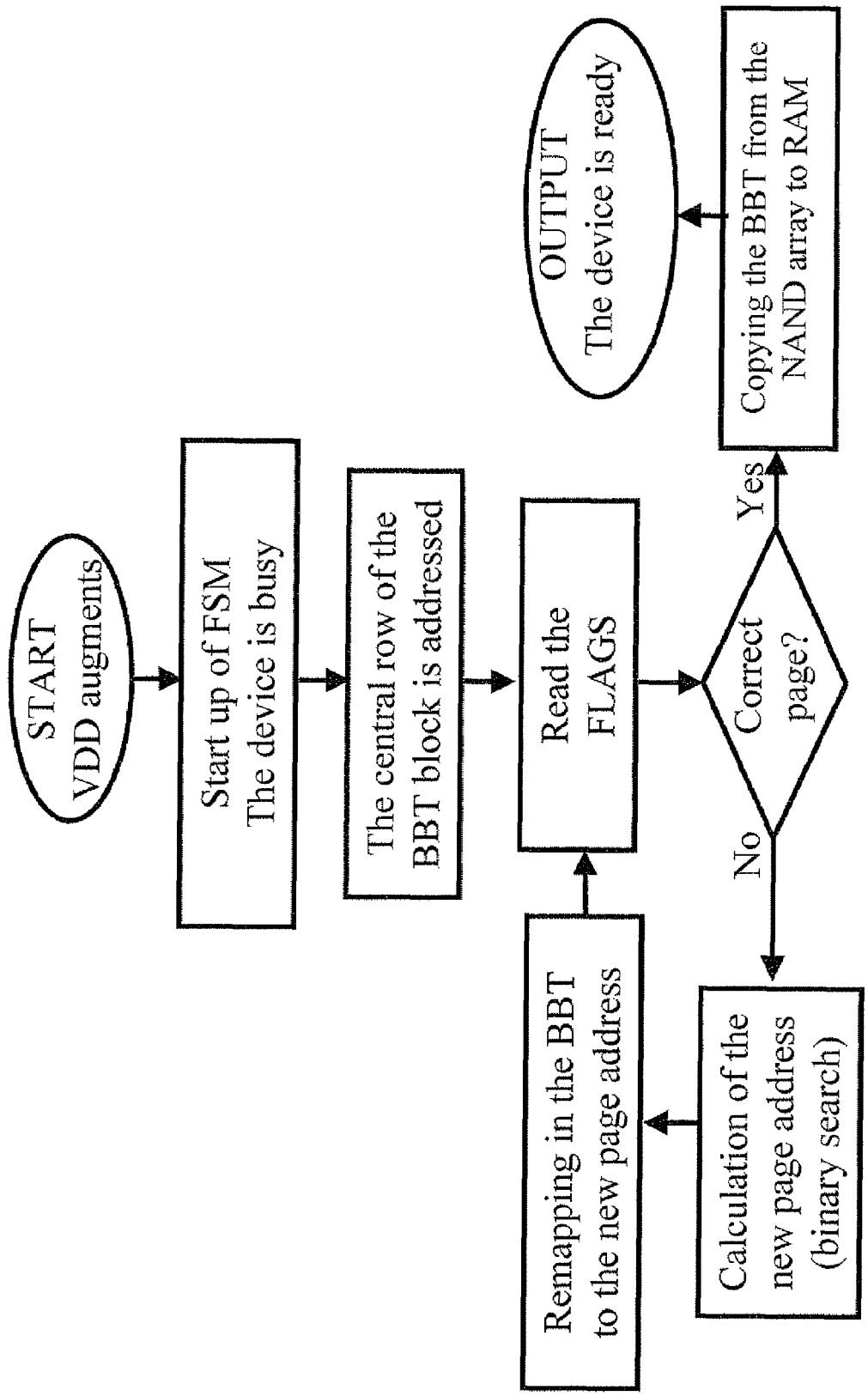
FIG. 8 is a flow chart of the read operation for the bad block table to be carried out at turn on of the memory device according to the invention.

Obviously, the above mentioned commands may be executed when the bad block address table has been read from the block BBT BLOCK. Preferably, this is carried out with the algorithm depicted in the flow chart of FIG. 8, and is clear for any skilled person and will not illustrated further.

A characteristic feature of the memory device comprises users making any number of good blocks of cells inaccessible by providing appropriate commands for writing their address in the bad block table.

Figure 9:
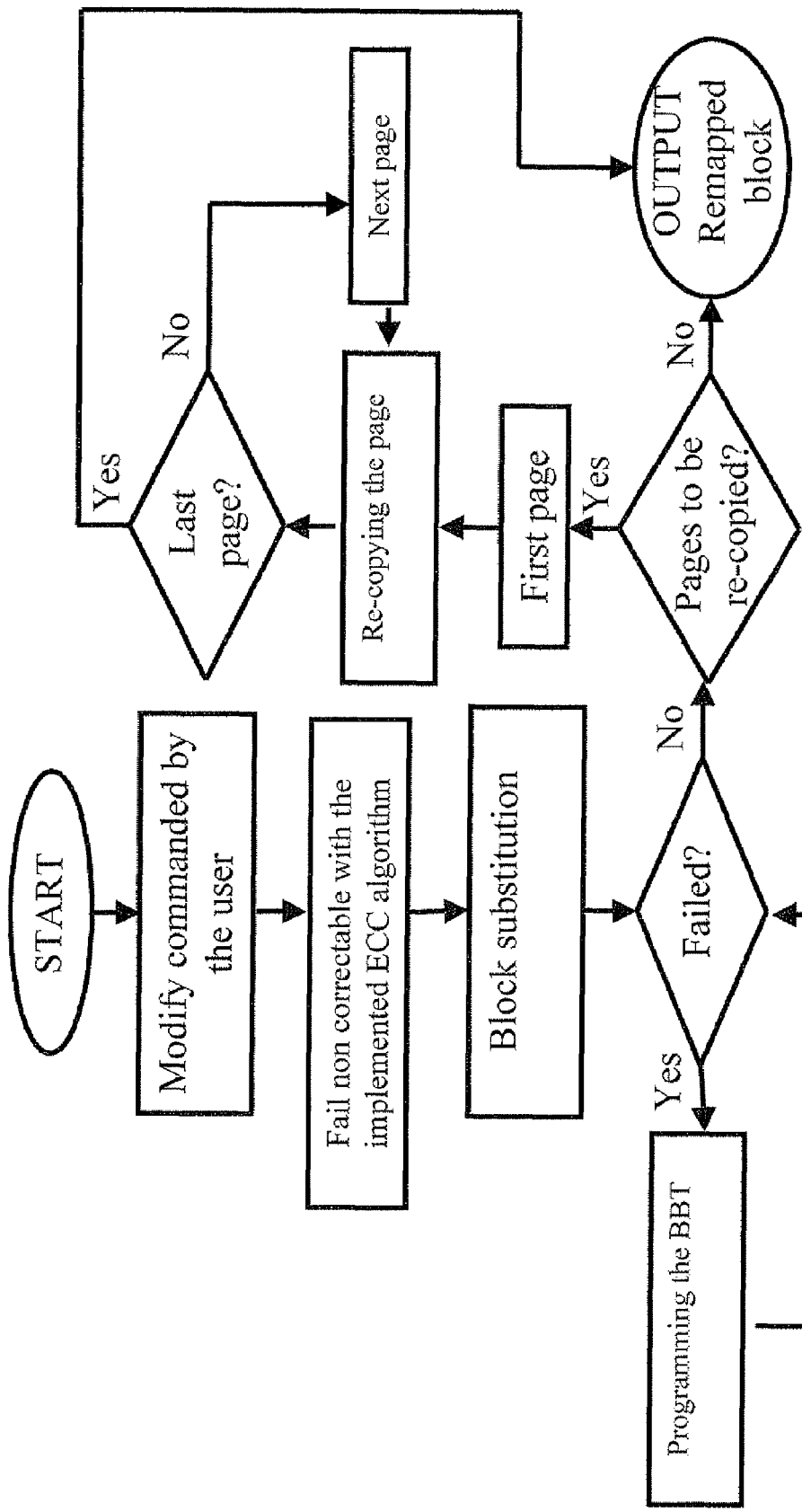
FIG. 9 is a flow chart of the substitution operation for a block of cells commanded by a user according to the invention.

The command USER BLOCK SUBSTITUTION, that generates the operations schematically described in the flow chart of FIG. 9, allows the user to substitute a block of cells even if it is not bad. Once a corresponding external command has been supplied to the memory device, the address of the block pointed by the address pointer of the memory is written in the bad block table and the block is substituted with a redundancy block. The used redundancy block will be remapped to the same address of the substituted block, that will become inaccessible by users.

Conveniently, a start address pointer procedure is executed. This comprises writing the address of the desired block in the address register, before executing a command for substituting a failed block.

Preferably, the content of a register BB STATUS (not depicted) that stores information for correct managing defective blocks (enabled/disabled management, presence of free redundancy sectors and free pages in the block that stores the table of bad blocks), is read before execution of the substitution command for verifying whether the substitution is admitted or not. In the case in which no redundancy block should be available, the command will not have any effect.

Figure 10:
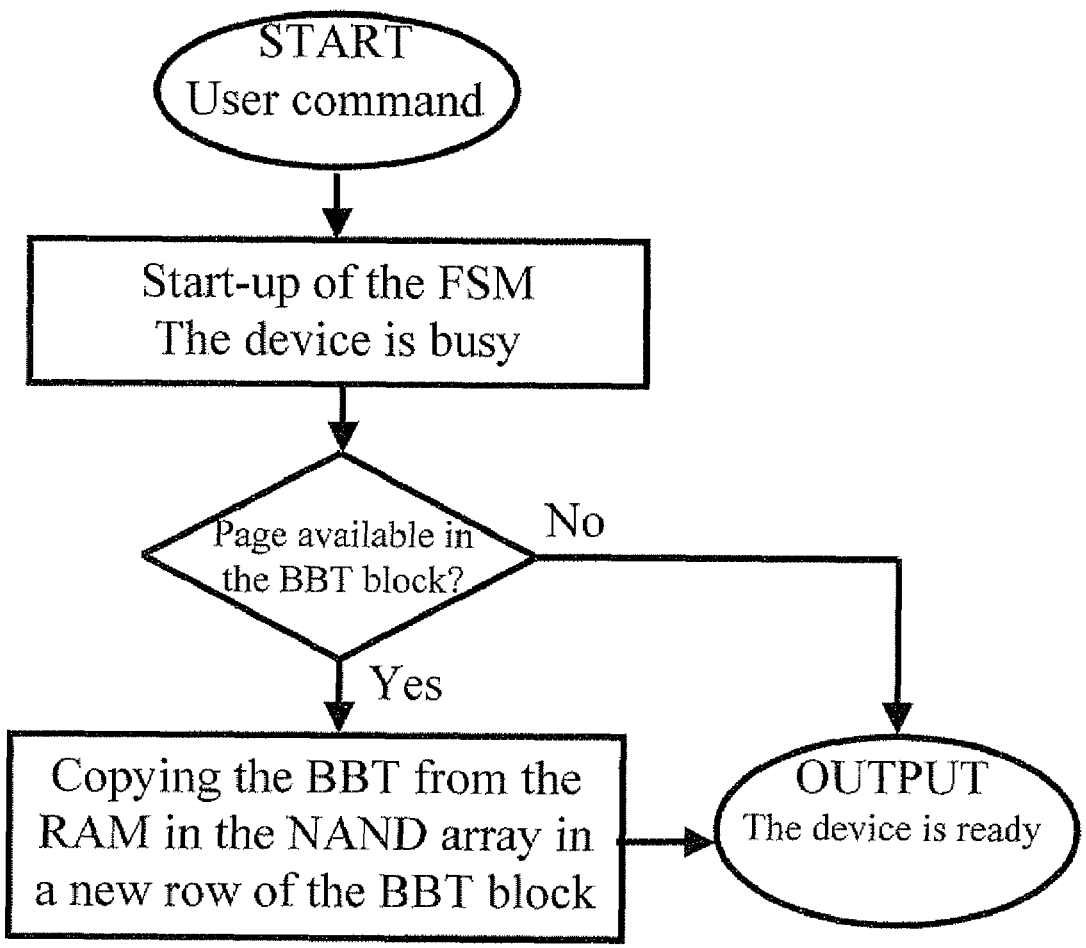
FIG. 10 is a flow chart of the write operation in the memory of the bad block table according to the invention.

The command for programming the bad block address table enables the operations illustrated in FIG. 10. It has the effect of programming the block BBT BLOCK without modifying the data already stored therein. This command could be used for example after the substitution operation of a bad block is not correctly terminated. This event may hardly occur because the block BBT BLOCK is never erased. For example, the block BBT BLOCK contains 32 dedicated pages for storing the bad block address table.

Figure 11:
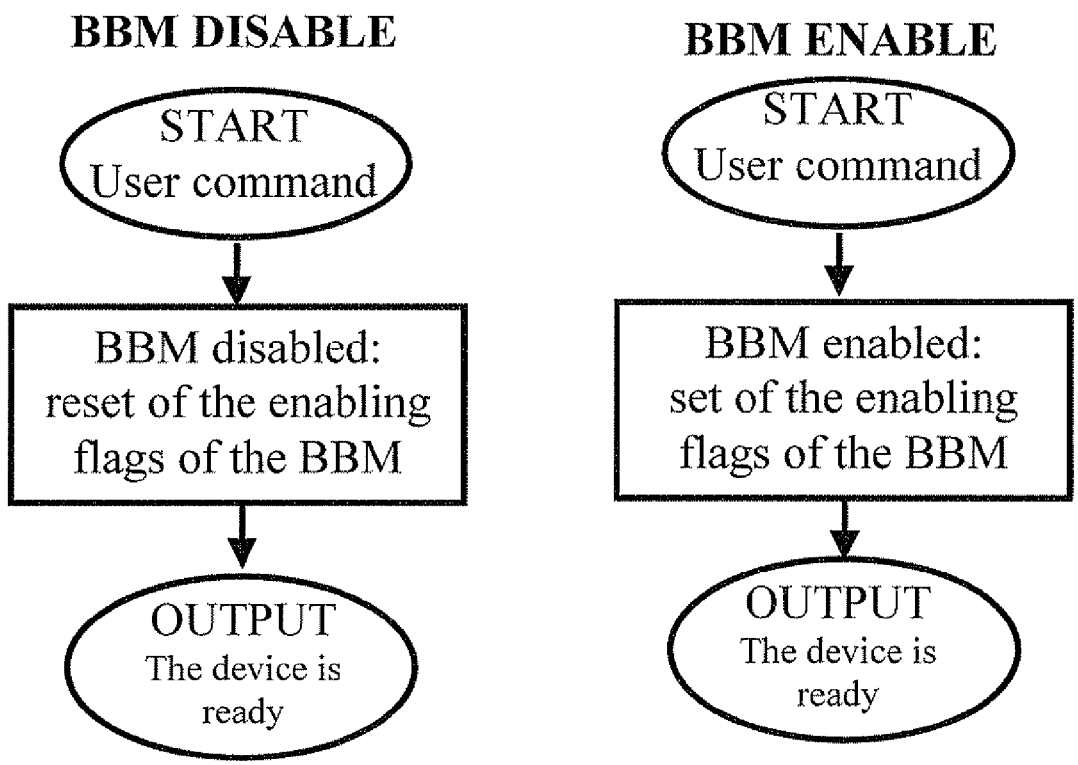
FIG. 11 shows flow charts of enable/disable operations carried out by the circuit for the bad block management (BBM) depicted in FIG. 2.

If the user gives the command BBM DISABLE, illustrated in the flow chart of FIG. 11, the management of bad blocks is disabled and the device will not accept any command for managing bad blocks. However, the command for reading a state register (not depicted in FIG. 2) that stores a flag that identifies enable/disable conditions of the bad blocks management is accepted. The inner remapping of the substituted blocks is disabled and users will see the old substituted bad blocks.

This command has a volatile effect. Once the memory device is turned off and on, the bad block management will be enabled again and user needs to provide again the command BBM DISABLE for disabling the bad block management.

If the user provides the command BBM ENABLE, the operations of which are schematically illustrated in FIG. 11, the bad block management is enabled. The last version of the bad block address table is loaded, and the device will accept all bad block management commands.

Figure 12:
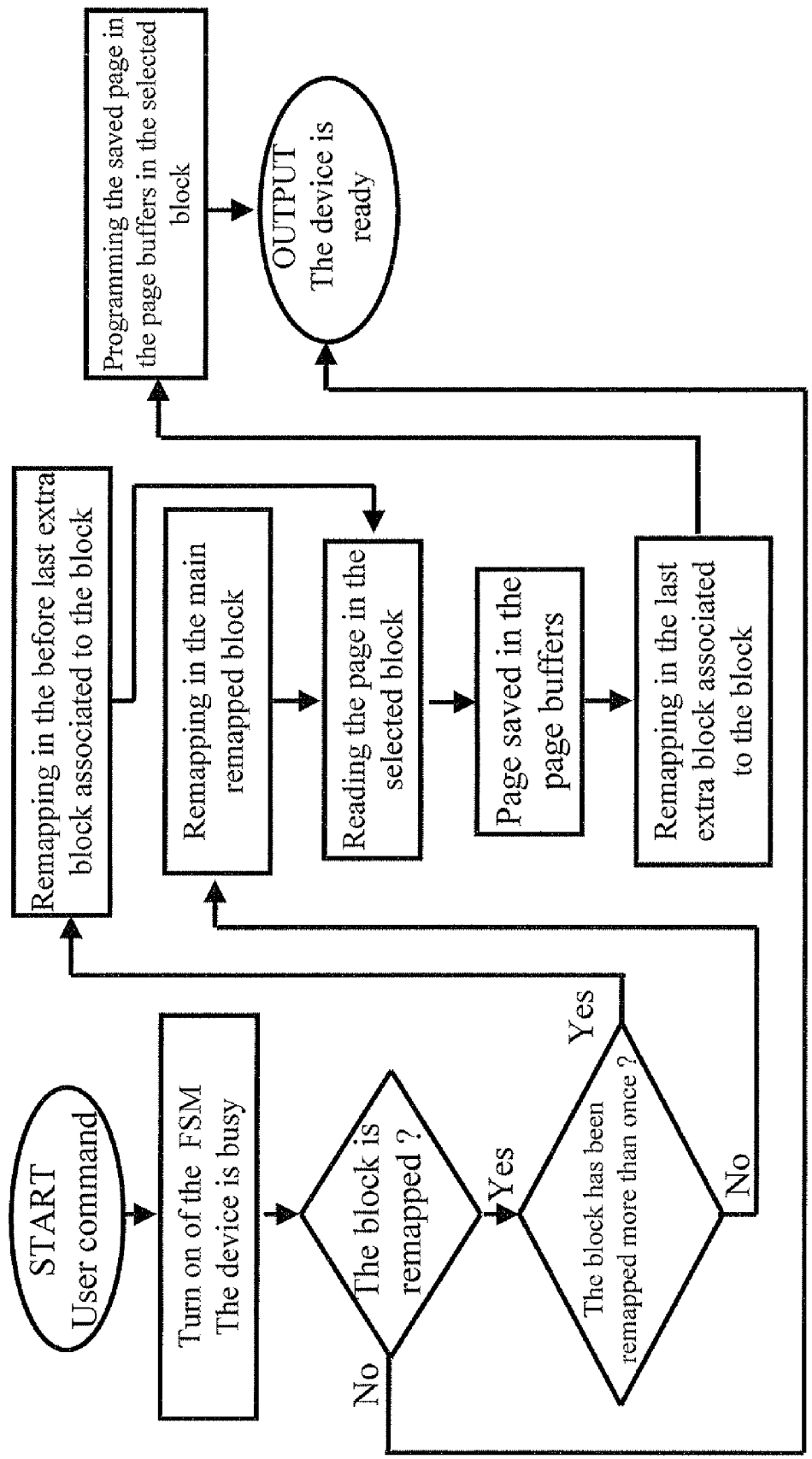
FIG. 12 is a flow chart of the copy operation of data stored in a page carried out by the circuit for the bad block management (BBM) depicted in FIG. 2.

Preferably, users will also have a command BBM PAGE COPY for copying pages from substituted blocks in new used redundancy blocks. Such an optional command will produce the succession of operations described in the flow chart of FIG. 12.

By providing the command for copying a page, the page pointed by the pointer start address will be read by the substituted block and programmed in the spare block in the same inner position. Clearly, the pointed page should be in the substituted block otherwise the command will not have any effect.

That which is claimed:

1. A method of managing failures in a non-volatile memory device including an array of addressable cells grouped in blocks of data storage cells, the method comprising:
   defining in the array a first subset of user addressable blocks of data storage cells, a second subset of redundancy blocks of data storage cells, and a third subset of non-user addressable blocks;
   locating blocks including one or more failed cells of the first subset during a test on wafer of the non-volatile memory device;
   storing, in the third subset, a bad block address table based at least in part on said locating of the blocks;

copying, at power-on of the non-volatile memory device, the bad block address table from the third subset to an embedded random access memory;

looking up the bad block address table copied in the embedded random access memory to determine whether a block of the first subset addressed by the user is bad and, if so, remapping access to a corresponding block of redundancy data storage cells;

determining, during operation of the non-volatile memory device, a failure of a block of cells previously not marked as bad, and updating the bad block address table in the embedded random access memory based at least in part on said determining of the failure of the block.

2. The method of claim 1 further comprising writing in a new page of the third subset an address table based at least in part on said updating of the bad block address table in the embedded random access memory.

3. The method of claim 1 further comprising defining a fourth subset of data storage cells, with each block of the first subset of user addressable blocks of cells being associated to a respective group of data storage cells of the fourth subset to be used for storing a code that indicates whether the first subset is good or bad.

4. The method of claim 3, further comprising repeating the storing a pre-established number of times.

5. Logic circuitry to manage failures in a nonvolatile memory device including an array of cells grouped in blocks of cells, the logic circuitry configured to:

copy, at power-on of the non-volatile memory device, a bad block address table from a first subset of non-user addressable cells of the array of cells to a random access memory, wherein each row of the bad block address table is associated with a corresponding block of redundancy cells;

determine an address of a first block of cells, addressed by a user, is in a first row of the bad block address table copied in the random access memory;

remap the address to access a first block of redundancy cells that is associated with the first row;

determine, during operation of the non-volatile memory device, a failure of a second block of cells whose address is not in the bad block address table; and update the bad block address table in the random access memory based at least in part on the failure of the second block.

6. The logic circuitry of claim 5 further configured to:

write, in a new page of the first subset, an address table based at least in part on the updated bad block address table in the random access memory.

7. The logic circuitry of claim 5, further configured to store a binary code in two cells of each row of the bad block address table that indicates whether or not the redundancy block assoc iated therewith is good and is being used.

8. A non-volatile memory device including an array of addressable cells grouped in blocks of data storage cells, comprising:

a first subset of user addressable blocks of data storage cells;

a second subset of redundancy blocks of data storage cells;

a third subset of non-user addressable blocks of data stor-age cells to store in a non-volatile fashion a bad block address table;

a manager to locate failed blocks of bad data storage cells during a test on wafer of the non-volatile memory device, marking the failed blocks of bad data storage cells as bad and associating therewith corresponding blocks of redundancy data storage cells, storing in a non-volatile memory a bad block address table includ-ing addresses of failed blocks, with each row of the bad block address table associated with a corresponding block of redundancy data storage cells, said manager comprising a random access memory wherein the bad block address table is to be copied at power-on of the non-volatile memory device, a controller coupled to the array and said random access memory, and said manager to determine an address of a block of data storage cells of the first subset is in a first row of the bad block address table copied in the random access memory, to remap the address to access to a first block of redundancy data storage cells that is associated with the first row, to determine, during operation of the memory device, a failure of a second block of data storage cells whose address is not in the bad block address table, and to update the bad block address table in the random access memory based at least in part on the failure of the second block.

9. The device of claim 8 further comprising address circuits coupled to the array and to the manager.

10. The device of claim 8 wherein the random access memory comprises an embedded random access memory.

11. The device of claim 8, wherein the manager is further configured to write, in a new page of the third subset, a bad block address table based at least in part on the updated bad block address table stored in the random access memory.

12. The device of claim 8 further comprising a fourth subset of data storage cells, with each block of the first subset of user addressable blocks of cells being associated to a respective group of data storage cells of the fourth subset to be used for storing a code that indicates whether the first subset is good or bad.

13. A method comprising:

copying, at power-on of a non-wolatile memory device, a bad block address table from a first subset of non-user addressable cells of an array of data storage cells of the non-volatile memory device to a random access memory, wherein each row of the bad block address table is associated with a corresponding block of redun-dancy cells of the array;

determining an address of a first block of cells of the array, addressed by a user, is in a first row of the bad block address table copied in the random access memory;

remapping the address to access a first block of redundancy cells that is associated with the first row;

determining, during operation of the non-volative memory device, a failure of a second block of cells whose address is not in the bad block address table; and updating the bad block address table in the random access memory baed at least in part on the failure of the second block.

14. The method of claim 13, further comprising:

storing a binary code in two data storage cells of each row of the bad block address table that indicates whether or not the redundancy block associated therewith is good and is being used.

15. The method of claim 13, further comprising:

writing, in a new page of the first subset, an address table based at least in part on the updated bad block address table in the random access memory.

16. The method of claim 13, further comprising:
storing a binary code in one or more cells of each row of the bad block address table that indicates whether or not the redundancy block associated therewith is good and is being used.

17. The method of claim 16, further comprising:
selecting the bad block address table from a plurality of bad block address tables in the first subset based at least in part on the binary codes stored in e ach row of the plurality of plurality of bad block address tables, and said copying based at least in part on said selecting.

18. The method of claim 13, wherein said updating comprises:
writing the address of the seconf block of cells in a second row of the bad block address table.

* * * * *

UNITED STATES PATENT AND TRADEMARK OFFICE
CERTIFICATE OF CORRECTION

PATENT NO. : 7,571,362 B2  
APPLICATION NO. : 11/557786  
DATED : August 4, 2009  
INVENTOR(S) : Demetrio Pellicone et al.

Page 1 of 1

It is certified that error appears in the above-identified patent and that said Letters Patent is hereby corrected as shown below:

In the Claims:

Col. 7, lines 52-53, claim 7 "… assoc iated …" should read --… asso-ciated …--;

Col. 8, line 39, claim 12 "… non-wolatile …" should read --… non-volatile …--;

Col. 8, line 56, claim 13 "… baed …" should read --… based …--;

Col. 10, line 1, claim 17 "… in e ach …" should read --… in each …--; and

Col. 10, line 6, claim 18 "… seconf block …" should read --… second block …--.

Signed and Sealed this

Twenty-ninth Day of September, 2009

David J. Kappos
*Director of the United States Patent and Trademark Office*